United States Patent
Di Censo et al.

(10) Patent No.: US 9,573,523 B2
(45) Date of Patent: Feb. 21, 2017

(54) SPATIAL SONIFICATION OF ACCELERATING OBJECTS

(71) Applicant: HARMAN INTERNATIONAL INDUSTRIES, INC., Stamford, CT (US)

(72) Inventors: Davide Di Censo, San Mateo, CA (US); Stefan Marti, Oakland, CA (US)

(73) Assignee: HARMAN INTERNATIONAL INDUSTRIES, INC., Stamford, CT (US)

( * ) Notice: Subject to any disclaimer, the term of this patent is extended or adjusted under 35 U.S.C. 154(b) by 0 days.

(21) Appl. No.: 14/331,984

(22) Filed: Jul. 15, 2014

(65) Prior Publication Data

US 2016/0016513 A1    Jan. 21, 2016

(51) Int. Cl.
| | |
|---|---|
| *B60Q 9/00* | (2006.01) |
| *H03G 3/32* | (2006.01) |
| *B60Q 1/54* | (2006.01) |
| *H04S 7/00* | (2006.01) |
| *G07C 5/00* | (2006.01) |
| *H04R 3/12* | (2006.01) |
| *B60R 16/037* | (2006.01) |

(52) U.S. Cl.
CPC .......... *B60Q 9/008* (2013.01); *B60Q 1/54* (2013.01); *G07C 5/00* (2013.01); *H03G 3/32* (2013.01); *H04S 7/30* (2013.01); *B60R 16/037* (2013.01); *H04R 3/12* (2013.01); *H04R 2499/13* (2013.01); *H04S 2400/13* (2013.01)

(58) Field of Classification Search
CPC ........... H04N 21/42202; H04N 21/422; H04N 21/42203; H03G 3/32; H03G 9/00; G10L 21/02; G10L 21/0208
See application file for complete search history.

(56) References Cited

U.S. PATENT DOCUMENTS

| | | | |
|---|---|---|---|
| 4,758,280 A | 7/1988 | Bergmann et al. | |
| 5,677,960 A * | 10/1997 | Unno | H03G 5/025 381/71.1 |

(Continued)

OTHER PUBLICATIONS

SoundScapes: Ecological Peripheral Auditory Displays, GT Sonification Lab, retrieved Jul. 10, 2014, <http://sonify.psych.gatech.edu/research/soundscapes/index.html>.

(Continued)

*Primary Examiner* — Van Trieu
(74) *Attorney, Agent, or Firm* — Artegis Law Group, LLP

(57) ABSTRACT

Embodiments provided herein describe a feedback system that alters the distribution of a sound in a vehicle from a default configuration indicating to the driver that his action is dangerous or inefficient. The feedback system monitors one or more forces or accelerations such as speeding up, slowing down, changing the vehicle's direction, etc. Moreover, the feedback system may have one or more thresholds associated with these accelerations. If the measured acceleration satisfies the threshold, the feedback system alters the distribution of sound to inform the driver that his driving decisions may be dangerous or inefficient (e.g., causing excessive wear and tear on the vehicle). Furthermore, the change in the sound distribution may mimic the effect of the force or acceleration on the driver or vehicle to provide a more subtle or intuitive sonification relative to outputting a distinct audio alert.

20 Claims, 5 Drawing Sheets

(56) References Cited

U.S. PATENT DOCUMENTS

| | | | |
|---|---|---|---|
| 2003/0076968 A1* | 4/2003 | Rast | H04B 1/082 |
| | | | 381/124 |
| 2004/0151328 A1* | 8/2004 | Hasegawa | H03G 5/22 |
| | | | 381/86 |
| 2004/0202337 A1* | 10/2004 | Jun | H03G 3/32 |
| | | | 381/107 |
| 2007/0013498 A1 | 1/2007 | Knoll et al. | |
| 2007/0188308 A1* | 8/2007 | Lavoie | H03G 3/32 |
| | | | 340/425.5 |
| 2008/0043996 A1* | 2/2008 | Dolph | H04N 5/60 |
| | | | 379/388.07 |
| 2010/0014691 A1* | 1/2010 | Moseley | H03G 3/32 |
| | | | 381/107 |
| 2012/0257767 A1 | 10/2012 | Schambeck | |
| 2013/0018537 A1 | 1/2013 | Arad | |
| 2013/0332004 A1* | 12/2013 | Gompert | G07C 5/0866 |
| | | | 701/1 |

OTHER PUBLICATIONS

Extended European Search Report Application No. 15173500.8, dated Dec. 15, 2015, 8 pages.

* cited by examiner

SPATIAL SONIFICATION OF ACCELERATING OBJECTS

BACKGROUND

Providing a driver with feedback typically provides a verbal or audio indication. For example, when a driver opens a car door with the headlights still on or the keys still in the ignition, many cars provide an audio alert (e.g., a series of beeps) to inform the driver that he might have forgotten to perform an action. Other systems may provide feedback to the driver when the vehicle is moving. For instance, the driver may be rapidly approaching another vehicle or be attempting to change lanes when another vehicle is located in his blind spot. Again, some systems provide an audio alert to warn the driver of the danger. The system may use sonification, which is the use of non-speech audio to convey information or perceptualize data, to provide the audio alert.

The types of audio alerts typically used, however, usually add to the driver cognitive load. That is, the driver has to process the audio alert and remember what the audio alert signifies. As such, the audio alert may be more distracting that it is helpful. For instance, the alert may cause the driver to over correct and place the driver in another dangerous situation. For some driver feedback systems, a more subtle or intuitive technique may be desired.

SUMMARY

One embodiment of the present disclosure includes a feedback system that includes a sensor and a force detection component configured to determine at least one of a force and acceleration associated with a vehicle based on information provided by the sensor. The feedback system also includes an audio distribution component configured to, upon determining that the at least one force and acceleration satisfy a threshold, change a distribution of a sound in a listening environment of the vehicle relative to a default configuration such that the change in the distribution of the sound mimics an effect of the at least one force or acceleration on the vehicle or a person inside the vehicle.

Another embodiment of the present disclosure includes a method that determines at least one of a force and an acceleration associated with a vehicle based on information provided by a sensor. Upon determining that the at least one force and acceleration satisfy a threshold, the method changes a distribution of a sound in a listening environment of the vehicle relative to a default configuration such that the change in the distribution of the sound mimics an effect of the at least one force and acceleration on the vehicle or a person inside the vehicle.

Another embodiment of the present disclosure includes a computer program product for providing feedback, the computer program product includes a computer-readable storage medium having computer-readable program code embodied therewith. The computer-readable program code is configured to determine at least one of a force and an acceleration associated with a vehicle based on information provided by a sensor and, upon determining that the at least one force and acceleration satisfy a threshold, change a distribution of a sound in a listening environment of the vehicle relative to a default configuration such that the change in the distribution of the sound mimics an effect of the at least one force and acceleration on the vehicle or a person inside the vehicle.

Figure 1:
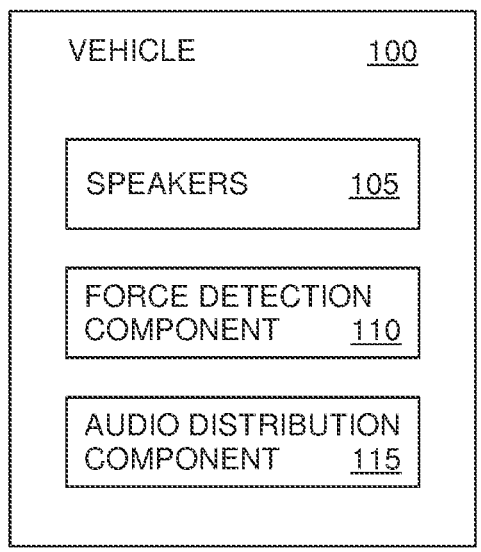
FIG. 1 is a vehicle that adjusts a distribution of sound among a plurality of speakers based on detected forces or accelerations.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments described herein disclose techniques for providing feedback by changing the distribution of sound within an interior of a vehicle. Instead of outputting discrete sounds (beeps, chimes, or other audio alerts), a feedback system changes the default settings (e.g., fade and balance) associated with a plurality of speakers that control the distribution of sound within the vehicle. In one embodiment, the change in sound distribution amongst the speakers corresponds to a force on the car. Stated differently, the change in the sound distribution mimics an effect the force (or acceleration) has on the vehicle or the driver. For example, if the driver initiates a left turn, the sound distribution may be altered so that the speakers on the right side of the vehicle output a greater portion of the sound while the speakers on the left side output a lesser portion of the sound relative to an initial or default configuration. Once the driver completes the turn (or the force falls below a predefined threshold), the sound configuration returns to the default configuration.

In one embodiment, the feedback system is configured to alter the sound distribution to indicate to the driver when his action is dangerous or inefficient. For example, the feedback system may be used to train or instruct the driver how he can improve his driving. In one embodiment, the feedback system monitors one or more forces or accelerations that are indicative of the motion of the vehicle such as speeding up, left or right turns, braking, etc. Moreover, the feedback system may have one or more thresholds associated with these forces or accelerations. If the measured force or acceleration satisfies the threshold, the feedback system alters the distribution of sound to inform the driver that his driving decisions may be dangerous or inefficient (e.g., causes excessive wear and tear to the vehicle). Furthermore, the thresholds may be adjustable to customize the feedback system for drivers with different skill levels. For instance, the thresholds may be higher for a seasoned driver than a novice driver who is learning how to drive.

FIG. 1 is a vehicle 100 that adjusts a distribution of sound among a plurality of speakers based on detected forces or accelerations, according to one embodiment described herein. Although the primary example used herein to describe the vehicle 100 is a car with an enclosed interior as the listening environment, this disclosure is not limited to such. The embodiments herein can be applied to any vehicle (e.g., airplane, boat, motorcycle, truck, amusement park ride, etc.) that includes a plurality of speakers 105 that can be used to alter a distribution of sound relative to a person (e.g., the driver or a passenger) in or on the vehicle. Moreover, the listening environment may be completely enclosed or one or more sides may be exposed to the outside such as the case with a motorcycle, boat, or amusement park ride. Further still, the listening environment may be a theater or virtual environment where the data found by measuring the forces or acceleration on a vehicle is then used to change the distribution of the sound playing in the theater or virtual environment to provide the user with an enhanced experience.

The speakers 105 may be arranged in any fashion within the vehicle 100. For example, cars typically include at least two speakers in the front and two speakers in the rear. By placing a plurality of speakers in different respective locations, the vehicle 100 provides a multi-directional sound experience for the driver. In other embodiments, the speakers are mounted in a steerable speaker array or the vehicle may include audio signal shaping surface to reflect, amplify, or otherwise manipulate sound signals emitted from the speakers. The speakers may provide stereophonic sound (more commonly referred to a stereo sound) that creates an illusion of directionality and audible perspective. Furthermore, instead of the speakers 105 being attached to the vehicle 100, the speakers 105 may be headphones worn by the user that are, for example, communicatively coupled to the feedback system via a headphone jack or wireless communication (e.g., Bluetooth®). Regardless of whether the speakers 105 are fixed to the vehicle 100 or movable (e.g., attached to actuators or worn on a person in the vehicle 100), the feedback system can alter the distribution of sound outputted from these speakers 105 as will be described in more detail below.

To provide feedback, vehicle 100 includes a force detection component 110 and audio distribution component 115 that are part of the feedback system. The force detection component 110 is used to measure one or more forces or accelerations associated with the vehicle 100. These measured values may be a result of the driver accelerating (e.g., increasing speed), slowing down (e.g., activating the brakes), or changing the direction of the vehicle (e.g., left or right turns). The force detection component 110 may receive input from one or more sensors located within the vehicle 100 and provide data to measure forces or accelerations on the vehicle or driver. Although "acceleration" is commonly used to refer to a driver increasing the speed of a vehicle 100, as used in this disclosure acceleration is not so limited and encompasses accelerations caused when the driver brakes or turns the vehicle.

The force detection component 110 may associate the measured force with a particular driver action. For example, if the component 110 determines based on sensor data that the car is rapidly slowing down, the component 110 may associate this force to the driver applying a brake. In one embodiment, each sensor may be associated with a driver action. That is, the feedback system may include a sensor for each type of driver action being monitored—e.g., a sensor for monitoring speeding up, a sensor for monitoring braking, a sensor for monitoring changing the vehicle's direction, and the like. Additionally or alternatively, the force detection component 110 communicates with other systems in the vehicle 100 such as steering or the braking system to identify the particular action being performed by the driver. In this manner, the force detection component 110 can better associate a measured force with a driver action.

In one embodiment, the measured force or acceleration and the associated driver action are forwarded to the audio distribution component 115 which may compare the measured force to one or more thresholds. Each driver action may correspond to one or more thresholds which are used by the audio distribution component 115 to determine when to change the distribution of sound in the vehicle 100. For example, the feedback system may alter the sound distribution only if the measured force or acceleration exceeds the threshold—e.g., when the vehicle experiences a predefined g-force value or other acceleration in a specified direction. Once the threshold is satisfied, the audio distribution component 115 changes the distribution of sound in the vehicle 100 relative to the default configuration. To do so, the audio distribution component 115 may be communicatively coupled to the speakers 105 in order to control their output. Although not shown, the audio distribution component 115 may distribute the audio signals to multiple amplifiers (or amplifier channels), which in turn drive the speakers 105.

In one example, the audio distribution component 115 changes the fade and/or balance of the speakers 105 to provide feedback to the driver. As used herein, the fade sets the front-to-rear ratio of the distribution of sound while the balance sets the passenger side-to-driver side ratio of the distribution of sound. The driver (or a passenger) in the vehicle 100 may set the default configuration to suit his specific taste. That is, the default distribution of sound is controlled by the specific fade and balance values set by the driver. To provide feedback, the audio distribution component 115 may change these values.

Alternatively or additionally, the audio distribution component 115 may use other parameters to change the distribution of sound. For instance, instead of changing an audio system's fade and balance settings, the audio distribution component 115 may target specific speakers and change the volume, or the component 115 may include pre-determined sound distribution programs that set the individual audio output of the individual speakers 105 based on the driver action. That is, for each driver action, the audio distribution component 115 selects the corresponding settings that change the sound distribution from the default configuration.

Furthermore, the change in the sound distribution may mimic the force being applied to the vehicle 100 or the driver. For example, when the driver turns the vehicle to the left, this acceleration causes the driver to be pulled to the right (a centripetal force). To mimic this physical effect on the driver, the audio detection component 115 may shift the distribution of sound so that more of the sound is being outputted from the rightmost speakers 105 than in the default configuration. For example, the audio detection component 115 may change the balance of the audio system so that more of the sound is outputted using the passenger side speakers than the driver side speakers. This may be accomplished by decreasing the volume of the passenger side speakers, increasing the volume of the driver side speakers, or some combination of both. This type of sonification—i.e., changing the sound distribution to mimic the physical forces exerted on the driver or the vehicle 100—will be discussed in more detail below.

Additionally, when changing the sound distribution using any of the examples provided above, the audio distribution component 115 may consider the empirical value of the measured force or acceleration. Stated differently, the audio distribution component 115 may change the distribution of the sound from the default configuration in proportion to the measured force. For example, once the audio detection component 115 determines that the threshold is satisfied and begins to alter the distribution of sound, the degree to which the component 115 alters the sound distribution may depend on the measured force. For instance, if the driver increases the speed of the vehicle 100 by 5 miles per hour every second, the audio distribution component 115 may begin to change the fade of the speakers 105 such that more of the sound is outputted from the rear speakers than the front speakers. If the driver then increases the vehicle's speed by, e.g., 8 miles per hour every second, the sound distribution may be increased proportionally—e.g., the fade is increased further such that even more of the sound is outputted from the rear speakers. However, if the driver decreased the acceleration, the component 115 may begin to revert the distribution of sound back to the default configuration. In this manner, as the driver increases the measured acceleration, the audio distribution component 115 can respond by further altering the distribution of sound. If the measured force or acceleration is sampled often enough, than the change in the sound distribution is perceived by the driver as a smooth transition. As the altered sound distribution continues to digress from the default configuration, the driver may become increasingly aware of the feedback.

Furthermore, scaling the change in the distribution of sound based on the values of the measured forces may be done even if the audio distribution component 115 does not use predefined thresholds. That is, any measured force or acceleration may trigger the audio distribution component 115 to alter the sound distribution. Once the audio distribution component 115 determines the driver's action has caused a measured force or acceleration, the component 115 may alter the sound distribution to mimic the effects of this force or acceleration as described above.

In one embodiment, the vehicle 100 may include only one speaker 105 or use only one speaker 105 to mimic multi-directional sound. For example, one speaker may be positioned in front of the driver. If the driver accelerates quickly, the sound would decrease, but if the driver decelerates, the output sound becomes louder. In another example, the speaker 105 may be connected to one or more actuators that control the orientation or position of the speaker 105. Assuming the speaker is mounted in a central location in the vehicle 100, the actuators may then change the orientation of the speaker 105 to make the output sound appear to come from a certain side of the vehicle. For instance, if the driver makes a sharp right turn, the actuators may pan the speaker 105 such that the output sounds appears to the driver as originating from the left side of the vehicle 100. In another embodiment, the speaker 105 may be mounted onto a rail and then move positions along the rail to provide a multi-directional sound.

FIGS. 2A-2D illustrate top views of adjusting the distribution of sound in the interior of a vehicle 100 based on detected forces or accelerations, according to embodiment described herein. In FIGS. 2A-2D, the roof structure has been removed to show the interior (or cabin) of the vehicle 100. Moreover, other features typically found in the vehicle 100 such as seats, steering wheel, dashboards, and the like have been removed.

Figure 2A:
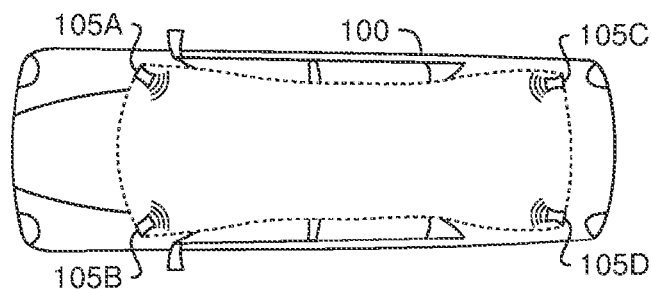
FIGS. 2A-2D illustrate top views of adjusting the distribution of sound in the interior of a vehicle based on detected forces or accelerations.
Figure 2B:
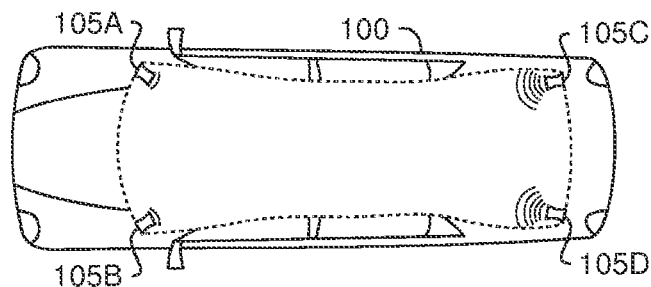

The vehicle 100 includes four speakers 105A, 105B, 105C, and 105D. The number and arrangement of these speakers 105 as shown in FIGS. 2A-2B is for illustration only. In other embodiments, the vehicle 100 may include any number of speakers 105 which may be arranged in any fashion within the vehicle 100. For example, some speakers 105 may be mounted near the floor of the interior while others are mounted eye level with the driver or in the roof. Furthermore, the arrangement of speakers need not be symmetrical—i.e., there may be a different number of speakers 105 on the driver's side of the vehicle 100 than the passenger's side. Moreover, as described above, the speakers 105 may be worn by the driver (e.g., as headphones) or actuated.

To represent the volume of each speaker 105, FIGS. 2A-2D provide curved lines near the output of the speakers 105 where more curved lines means a greater volume. As shown in FIG. 2A, each speaker 105 is associated with the same number of curved lines indicating that each speaker 105 is outputting the sound at the same volume although this is not a requirement. In other embodiments, the speakers may serve different purposes and thus may not output the same sounds. For example, different speakers 105 may be associated with different channels of an audio output—e.g., a bass speaker or subwoofer typically outputs a different sound for an audio presentation than a tweeter speaker. Regardless of the particular audio configuration in the vehicle 100, the default configuration (e.g., the configuration shown in FIG. 2A) can be altered to provide feedback to the driver. However, for the embodiments discussed below, it is assumed the four speakers 105 are the same type of speaker and output the same sound.

Instead of outputting a discrete sound when attempting to provide feedback to the driver, the feedback system uses the sound already being outputted by the speakers 105. That is, the feedback system may change the distribution of the sound already being playing by the vehicle's audio system. Non-limiting examples of suitable sounds include music, speech, ambient sounds (e.g., sounds occurring outside the vehicle 100 such as wind, rain, road noise, etc. which may be captured with acoustic transducers mounted on the outside or inside of the vehicle 100), pre-recorded sounds, and the like. For example, the sound may be a song playing on the radio or recorded on a CD or MP3 player. Based on the measured forces or accelerations, the audio distribution component of the feedback system alters how the speakers 105 output the sound (e.g., the music's distribution among the speakers 105) to provide the feedback to the driver. In another embodiment, the feedback system may add a sound to the sound that is already being played by the vehicle's audio system. For example, the driver may already be playing music or listening to talk radio. In addition to these sounds, the feedback system may instruct the audio system to also output a pre-defined sound (e.g., rain or road noise). In response to a measured force or acceleration satisfying a threshold, the audio distribution component then alters the distribution of this pre-defined sound to provide feedback to the driver while leaving the distribution of the original sound (e.g., the music or talk radio) unchanged.

In one embodiment, the feedback system does not alter the characteristics of the sound except for changing the amplitude at which the speakers 105 output the sound. For example, the feedback system does not change the tempo of the sound (e.g., speed up or slow down the sound), pitch, or rhythm. Instead, whatever sound is currently playing on the vehicle's audio system (e.g., music, talk radio, commercials, etc.) may be used to provide feedback by altering the output volume of one or more of the speakers 105 generating the sound. Advantageously, the characteristics of the sound such as tempo, pitch, and rhythm remain unchanged but how the sound is distributed within the vehicle 100 is altered.

FIG. 2B illustrates changing the sound distribution relative to the default configuration shown in FIG. 2A. In one embodiment, the change in sound distribution shown in FIG. 2B corresponds to when the driver accelerates the vehicle 100 in the forward direction. In response to detecting the acceleration, the audio distribution component 115 changes the distribution of the sound such that the volume of the front speakers 105A, B is increased while the volume of the back speakers 105C, D decreases. Thus, the change in sound distribution mimics how the effect of the acceleration is perceived by the driver. That is, similar to the driver feeling pushed back into the seat by the acceleration, the sound is "pushed" back into the rear part of the interior. Illustratively, by changing the sound distribution, the sound mimics how, for example, water would behave. The vehicle's acceleration would force the water to rush into the rear of the car. Because the sound distribution is controlled to act in a similar manner, the driver intuitively associates the change in the sound distribution to his action—i.e., increasing the speed of the vehicle 100.

Although FIG. 2B illustrates decreasing the volume of the front speakers 105A, B and correspondingly increasing the volume of the back speakers 105C, D, this is not a requirement. Instead, by changing the relationship between the front and back speakers 105 (i.e., the distribution of sound is changed relative to the default configuration), the feedback system provides feedback to the user. This may be done by only decreasing the volume of the front speakers 105A, B or only increasing the volume of the rear speakers 105C, D.

As mentioned previously, the change in the sound distribution may be proportional to the measured force or acceleration. For example, the harder the driver pushes the gas pedal to accelerate the vehicle 100, the greater the disparity between the default configuration and the altered distribution. That is, the sound outputted by the rear speakers 105C, D becomes more and more dominant. Furthermore, as the measured force changes, the sounds distribution may also change dynamically. For example, the driver may initially accelerate such that the majority of the sound is outputted by the rear speakers 105C, D but then decrease his acceleration once he perceives this sound shift. In response, the feedback system may reverse the change in the sound distribution such that it approaches the default or pre-adjusted configuration.

Figure 2C:
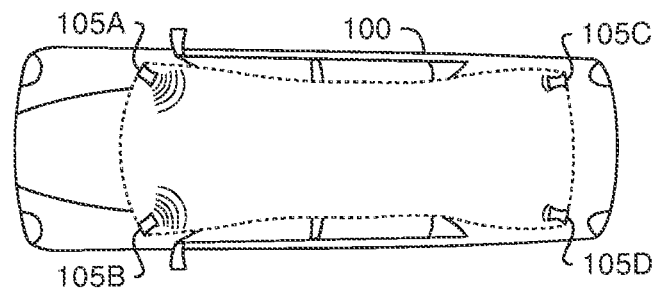

FIG. 2C illustrates changing the sound distribution relative to the default configuration shown in FIG. 2A in response to the vehicle decelerating (i.e., accelerating in a backwards direction). Opposite to the change in the sound distribution shown in FIG. 2B, here, the volume of the front speakers 105A, B may be increased while the volume of the rear speakers 105C, D is decreased. Like FIG. 2B, FIG. 2C illustrates just one way of altering the distribution of sound and is not intended to be a limiting example. FIG. 2C instead illustrates the general concept that changing the relationship between the front and rear speakers 105 can inform the driver that he is using the brakes to slow the vehicle too rapidly. In response, the driver can correct this habit or behavior by slowing down earlier, being more aware of his surroundings, or traveling at slower speeds.

In one embodiment, the feedback system may consider input from other systems in the vehicle 100 before altering the sound distribution. For example, the feedback system may determine whether the backwards and forwards accelerations that trigger the sound distribution changes shown in FIGS. 2B and 2C are from the terrain or from the driver's action. If the vehicle 100 is traveling up a road with a steep grade (e.g., up a hill), the backwards acceleration may be a result of the incline rather than the driver pressing on the brake. As such, if the braking system reports to the feedback system that the driver is not pressing the brake pedal, the feedback system may not alter the sound distribution. Similarly, if the vehicle 100 is traveling down a steep hill, the forward acceleration may be a result of gravity rather than the driver accelerating quickly. As such, the measured acceleration may be ignored.

In addition, the sensors (e.g., accelerometers or gyroscopes) may be configured to account for the orientation of the vehicle. For example, if the vehicle is traveling up or down a hill, the acceleration from gravity may be ignored (or compensated for) in order to provide the feedback system with the acceleration caused by the driver's action such as pressing the gas or brake pedal. In another embodiment, the terrain may be considered when determining when to provide feedback to the driver. If, for example, the driver is braking while traveling down a hill, the force of gravity may be considered when determining whether to alter the sound distribution. The feedback system may want to instruct the driver that additional time is needed to slow down when the terrain is sloped, and thus, the vehicle's orientation or the force of gravity may be used as criteria to determine when to change the sound distribution.

Figure 2D:
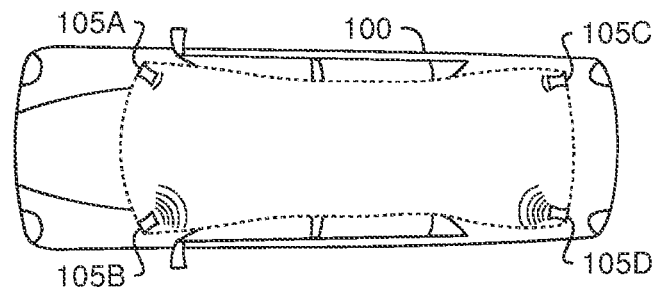

FIG. 2D illustrates changing the sound distribution relative to the default configuration shown in FIG. 2A in response to the vehicle accelerating in a lateral direction when making a turn. Here, the sound distribution is altered by increasing the volume of the driver side speakers 105B, D and decreasing the volume of the passenger side speakers 105A, C. Like in FIGS. 2B and 2C, the change in the sound distribution may be proportional to the measured force or acceleration. For example, the sharper the turn (assuming vehicular speed is constant), the greater the disparity between the default configuration of the sound distribution and the altered distribution shown in FIG. 2D. That is, the sound outputted by the driver side speakers 105B, D becomes more and more dominant. Furthermore, the sound distribution may also change dynamically along with the measured force or acceleration.

In one embodiment, the audio distribution component considers the speed of the vehicle when determining whether to change the sound distribution. Regardless of the speed of the car, some lateral acceleration will occur when turning the vehicle 100. The amount of acceleration depends on the speed the vehicle is traveling as well as the sharpness of the turn. For very sharp turns (e.g., switchbacks or turns onto perpendicular side roads) the lateral acceleration may be large even if the speed of the vehicle is reasonable. As such, the audio distribution component may have a minimum threshold based on the speed the vehicle is traveling. If the vehicle is traveling below the minimum threshold, regardless of the measured lateral acceleration, the audio distribution component does not alter the sound distribution. Additionally or alternatively, the audio distribution component may use a relationship (e.g., an equation) that balances the measured lateral acceleration with the speed to determine whether the sound distribution should be altered. Thus, even if the lateral acceleration is large, when placed in context of the vehicle's speed, the feedback system may determine the driver's action is neither dangerous nor causes excessive wear to the vehicle and the measured lateral acceleration can be ignored.

FIGS. 3A-3D illustrate side views of adjusting the distribution of sound in the interior of the vehicle based on detected forces, according to embodiments described herein. Unlike FIG. 2A-2D which illustrate top views of the vehicle 100, FIGS. 3A-3D illustrate cross section views of the vehicle's interior 305. To convey the change in sound distribution, the interior 305 is partially filled with hashing which illustrate the distribution of sound 310 in the vehicle 100.

Figure 3A:
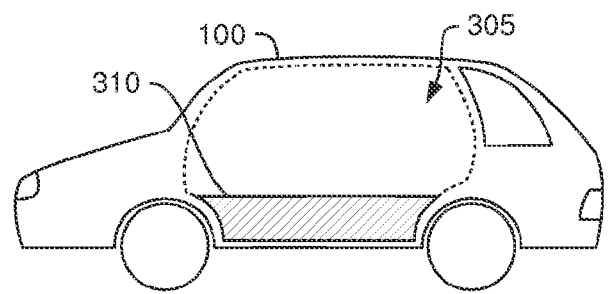
FIGS. 3A-3D illustrate side views of adjusting the distribution of sound in the interior of the vehicle based on detected forces.

FIG. 3A illustrates the default configuration of the audio system of the vehicle. Here, the sound distribution 310 is distributed evenly throughout the interior. For example, each of the speakers may output the same amount of sound (ignoring any specialty speakers such as subwoofers or tweeters). However, in other embodiments, the default configuration may be the customized setting set by the driver. For example, the driver may have a child sleeping in the back seat and increase the fade such that front speakers are tasked with outputting more of the sound than the back speakers. Or the passenger may prefer to hear louder music than the driver in which case the default configuration is to output greater volume from the passenger side speakers than the driver side speakers. The general concept illustrated in FIGS. 3B-3D is that the audio distribution component changes the default configuration such that the sound mimics the effect of the driver's action, thereby providing feedback to the driver.

Figure 3B:
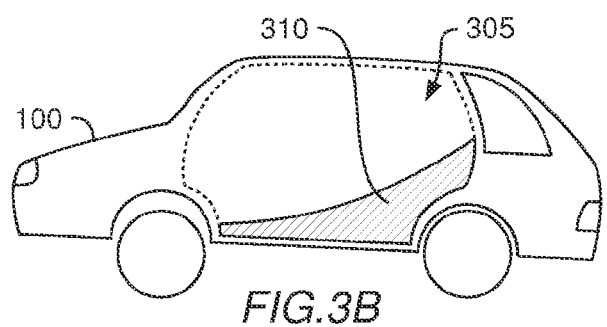

FIG. 3B illustrates changing the sound distribution relative to the default configuration shown in FIG. 3A in response to the vehicle 100 accelerating in the forward direction (i.e., speeding up the vehicle 100). As shown, the distribution of sound 310 is shifted such that more of the sound is in the rear of the vehicle's interior 305 (i.e., the sound is louder in the rear of the vehicle 100) than in the front of the interior 305. In one embodiment, the total amount of sound may be maintained by compensating for whatever additional volume is outputted from the rear speakers by correspondingly decreasing the volume outputted by the front speakers. However, this is not a requirement. A similar effect may be provided by only increasing the volume of the rear speakers and leaving the volume of the front speakers constant, or by only decreasing the volume of the front speakers. However, the driver may more easily perceive the change in the sound distribution if the volumes of the front and rear speakers are both changed as illustrated in FIG. 2B.

Figure 3C:
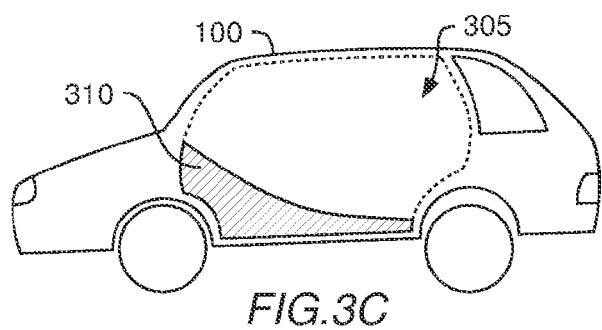
Figure 3D:
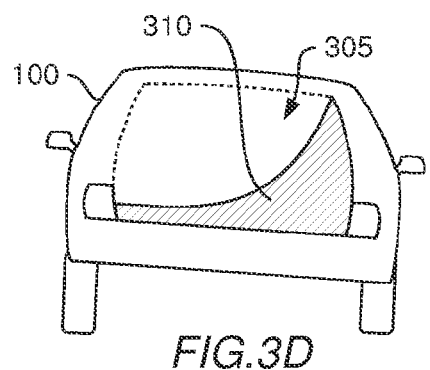

FIG. 3C illustrates changing the sound distribution 310 relative to the default configuration shown in FIG. 3A in response to the vehicle 100 accelerating in the backward direction (i.e., slowing down the vehicle 100). Opposite of FIG. 3B, the sound distribution 310 here is shifted to the front of the vehicle such that the volume of the front speakers is increased while the volume of the rear speakers is decreased as shown in FIG. 2C. Again, a similar effect may be generated by only increasing the volume of the front speakers or only decreasing the volume of the rear speakers. In these situations, the total volume of the sound in the vehicle's interior 305 would change.

In one embodiment, the audio distribution component generates a splash effect based on the rate of change in the sound distribution 310. The splash effect may provide an additional indication to the driver of an unsafe or harmful action. For example, if the driver quickly speeds up the car or "slams" on the brakes, the audio distribution component may initiate the splash effect that mimics what water would do in the interior 305 if subjected to the same acceleration. If the measured acceleration changes rapidly from no acceleration to a large amount of acceleration which occurs when the driver stomps of the brake or presses the gas pedal to its maximum throttle, the audio distribution component exaggerates the shift in the sound distribution 310 to provide the splash. Instead of the sound distribution changing from the distribution 310 shown in FIG. 3A to what is shown in FIG. 3C, the sound distribution 310 may exceed what is shown in FIG. 3C such that the front speakers output even more of the sound relative to the rear speakers. Stated differently, the audio distribution component monitors the rate at which the force or acceleration changes in order to determine when to trigger the splash effect. Once the rate of change of the acceleration decreases, the audio distribution component may reduce the sound distribution 310 to the steady state distribution 310 shown in FIG. 3C. By exaggerating the change in the sound distribution 310, the feedback system may provide a more apparent warning that the driver's action may be harmful or dangerous.

In one embodiment, the audio distribution component uses speakers that are closest to the driver to convey the splashing effect. These speakers may be part of a 3-D audio system rather than only a 2-D audio system. The vehicle 100 may include speakers that are near the driver's head such as on vehicle's roof or upper part of the driver side door. When the splash effect is triggered, the audio distribution component may increase the volume of these speakers when the rate of the acceleration change exceeds a predefined threshold. However, once the rate falls below the threshold, the volume of the speakers closest to the driver may be reduced. Nonetheless, the volume of other front speakers (e.g., front speakers integrated into the lower part of the door or the dashboard) may remain high. That is, when the splashing effect is triggered when braking, the volume output of all the front speakers may be increased. The splashing effect is removed by then reducing the volume of some of the speakers (e.g., the speakers closest to the driver) while the volume of other front speakers is maintained to provide the change in distribution 310 shown in FIG. 3C.

FIG. 3D illustrates a cross section of the vehicle 100 as viewed from the rear. In this example, the vehicle 100 is making a left turn and as a result the audio distribution component shifts the sound distribution 310 towards the right side of the interior 305 in a similar manner that water would behave. To accomplish this redistribution, the audio distribution component may adjust the balance between the passenger side and drive side speakers where the volume of the passenger side speakers is increased and the volume of the driver side speakers is decreased. Of course, a similar effect occurs if only one of these volume changes is performed rather than both.

Furthermore, for any of the changes in distributions 310 shown in FIGS. 3B-3D, the audio distribution component may change only speakers that are near a particular person in the vehicle 100 (e.g., speakers near the driver) while leaving the output volume of other speakers in the vehicle 100 unchanged. Doing so may still provide the feedback to the driver yet not affect the listening experience of other passengers in the vehicle 100. For example, the vehicle 100 may have a speaker mounted in the headrest behind the driver and a speaker mounted in the dashboard in front of the driver. To provide feedback when the driver has braked too rapidly, the volume of the speaker in the headrest is decreased while the volume of the dashboard speaker is increased. But a speaker in the dashboard near the front seat passenger and the speakers in the rear of the vehicle 100 may remain unchanged. Advantageously, the listening experience of those passengers is less affected since the change in the sound distribution is localized near the driver. In another example, when the driver makes a turn that the feedback system deems is too sharp, only the balance in the speakers in the front of the vehicle 100 is changed while the balance of the speakers in the rear of the vehicle 100 is unchanged. In this manner, the listening experience of passengers in the rear seats of the vehicle 100 is affected less relative to changing the balance between all of the speakers in the vehicle 100 as shown in FIG. 2D, for example.

Figure 4:
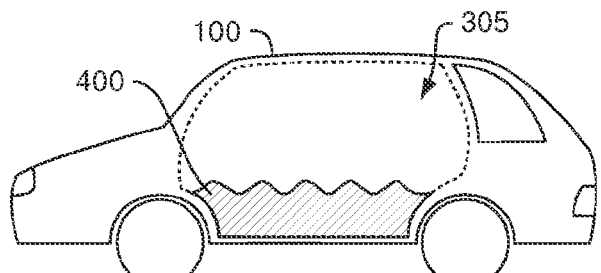
FIG. 4 illustrates adjusting a distribution of sound in the interior of a vehicle based on the vehicle's speed.

FIG. 4 illustrates adjusting a distribution of a sound in the interior of a vehicle based on the vehicle's speed, according to one embodiment described herein. Unlike in FIGS. 2A-2D and 3A-3D where the distribution of the sound is triggered based on a force or acceleration, here the feedback system changes the sound distribution 400 based on vehicular speed. The feedback system may determine the speed limit for a particular road using, for example, a GPS system that knows the speed limit, or an image capture system that identifies the speed limit by capturing images of speed limit signs next to the road. The feedback system then compares the speed limit to the vehicle's current speed to determine if the driver is speeding. If so, in the example shown in FIG. 4, the feedback system makes the sound choppy by constantly varying the distribution of sound. That is, for a fixed reference point in the interior 305 of the vehicle 100, the volume of the sound would change either periodically or continuously to indicate the driver is speeding. For example, the volume of one or more speakers may be oscillated around the current volume setting. Moreover, the oscillating speakers can be synchronized such that they have the same oscillation patterns or phase-shifted patterns. As an example of the latter, the volume of a driver side speaker may be increased above the current volume setting while the volume of a passenger side speaker is decreased below the current volume setting at one point of time but the volume relationship is reversed at a later point of time.

Additionally, the feedback system may change a characterization of the sound rather than changing only the distribution of the sound by altering the output volume of the speakers. For example, the feedback system may speed up the tempo (i.e., if the sound is music) or cause the pitch of the sound to change to indicate that the driver is speeding.

Figure 5:
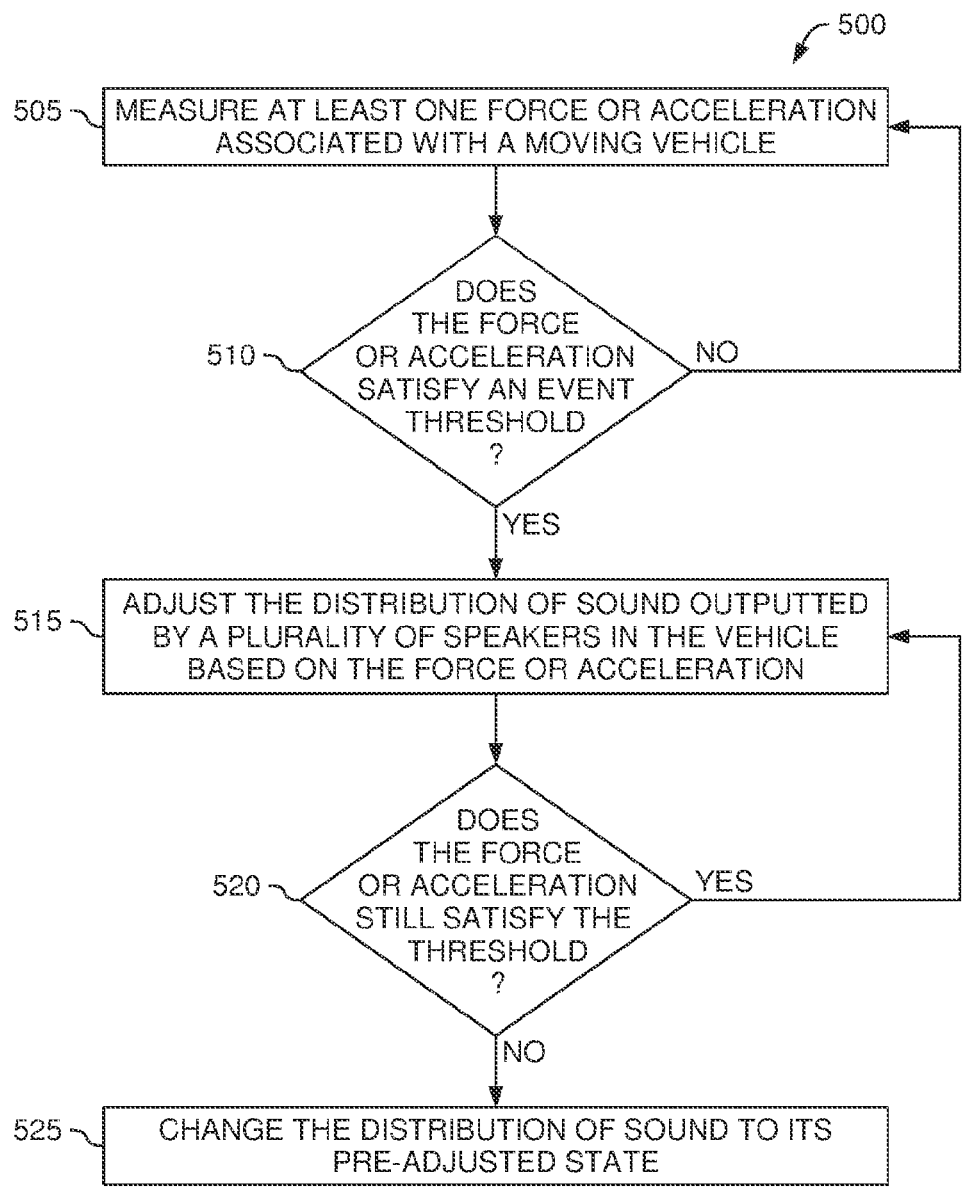
FIG. 5 is a flowchart for adjusting the distribution of sound in the interior of the vehicle based on detected forces or accelerations.

FIG. 5 is a flowchart for adjusting the distribution of sound in the interior of the vehicle based on detected forces. Method 500 begins at block 505 where the force detection component measures at least one force or acceleration associated with a moving vehicle. To so do, the force detection component may include or be coupled to one or more sensors (e.g., accelerometers and/or gyroscopes) that measure the force or acceleration associated with the vehicle. Additionally or alternatively, an acceleration may be determined based on the rate at which the speed of the vehicle changes. For example, the force detection component may be connected to an on board computer that provides the current speed of the vehicle to the component. By monitoring the speed, the force detection component can determine the acceleration of the vehicle in the forward or backward direction.

In one embodiment, the force detection component assigns the force or acceleration to a particular driver action such as speeding up, slowing down, or turning the vehicle. For example, an accelerometer may detect an acceleration that is caused by something other than the driver's action such as the vehicle accelerating when traveling down a steep incline or a sudden wind gust that turns or slows down the car. To distinguish between these events and the driver's actions, the force detection component may communicate with other systems in the vehicle such as the steering, acceleration, and braking systems to determine if the driver caused the measured acceleration or if the acceleration is a result of environmental conditions—e.g., road grade, wind, and the like. If the measured force or acceleration is not a result of a driver action, it may be ignored.

At block 510, the measured force or acceleration is passed to the audio distribution component which determines whether the force or acceleration satisfy an event threshold. In one embodiment, the audio distribution component may have one or more thresholds for each type of drive action or event. The type of driver action the assigned to the measured acceleration or force determines the value of the event threshold. For instance, the audio detection component may ignore accelerations less than 1 g-force resulting from the driver speeding up the vehicle but ignore accelerations less than a 1.5 g-force resulting from driver applying the brakes.

If the measured force or acceleration satisfies the threshold, at block 515, the audio distribution component adjusts the distribution of sound outputted by a plurality of speakers in the vehicle. That is, once the threshold is satisfied, the audio distribution component begins to alter how one or more speakers output the current sound being played by the audio system. Before changing the sound distribution, the audio vehicle may be playing music, a program on the radio, book on tape, pre-defined noise, etc. which is outputted from the speakers using the default or current audio configuration. However, after the threshold is satisfied, the audio distribution component changes the volume of at least one speaker which changes the distribution of the sound in the vehicle. This may be done by changing the volume of individual speakers, changing the fade and/or balance settings of the audio system, and the like. As such, in one embodiment, the audio distribution component uses the sound already being outputted from the speakers rather than introducing a new sound to provide the audio feedback.

As described above, the change in sound distribution may mimic the effect of the force or acceleration on the driver or the vehicle. For example, if the acceleration from making a left hand turn causes the driver to slide towards the right side of the car, the distribution of sound similarly shifts to the right side of the vehicle. By changing the sound distribution to mimic the effects of the acceleration, the driver can intuitively associate the change in sound distribution to his action—i.e., speeding up too quickly or making too sharp of a turn. Different examples of changing the distribution of sound based on the acceleration or force caused by the driver's actions are shown in FIGS. 2B-2D and 3B-3D.

In one embodiment, the degree to which the audio distribution component changes the sound distribution from the default or current configuration depends on the empirical value of the force or acceleration. For example, if the driver brakes and causes a 2.0 g-force, the audio distribution component shifts the sound distribution more towards the front of the vehicle than if the driver caused a 1.5 g-force. The audio distribution component may include a plurality of thresholds associated with a particular force, acceleration, or driver action where each threshold is associated with a different change in the sound distribution. As the measured acceleration satisfies a greater number of thresholds, the shift in the sound distribution away from the default configuration becomes more pronounced. In another embodiment, the audio detection component may include an algorithm or an equation that is used to identify the output volumes of the speakers based on the empirical value of the measured force or acceleration. Regardless of the particular implementation used, the audio distribution component may dynamically adjust the change in the sound distribution in proportion to the measured force or acceleration.

In one embodiment, the audio distribution component monitors the sound currently being outputted by the audio system to determine if it is suitable for method 500. Some sounds may be less preferred than others. For example, a driver may be better able to perceive a change in the sound distribution if music is playing rather than talk radio. Moreover, different types of music may be better than others. Classical music, for example, typically varies more than modern music where the volume or rhythm is more constant. Depending on the sound currently being outputted by the audio system, the driver may be unable to tell if his actions caused a change in the sound distribution or if the sound simply reached a quite portion. To prevent this ambiguity, the audio distribution component may monitor the sound being played from the speakers and perform a corrective action to ensure the sound is suitable for method 500. For example, the audio distribution component may detect when there is less preferred sound being outputted by the audio system and add a more preferred sound. In one scenario, the audio distribution component may detect speech (i.e., during a commercial, audio book, talk radio, etc.) and instruct the audio system to also output a pre-defined sound where a change in its distribution is easier for the driver to perceive—e.g., road noise, white noise, rain, etc. The audio system may output the pre-defined sound such that the passengers in the vehicle can still hear the human voice. Upon detecting an event at block 510, the audio distribution component changes the distribution of the pre-defined sound in the vehicle as discussed above. The distribution of the human voice can also change or remain unchanged.

Another corrective action may be ensuring that the sound does not fall below a minimum volume. By keeping music from going below the minimum volume, the audio distribution component can ensure that when an event is detected at block 510, the change in sound distribution will be perceived by the driver. That is, if the component has to further reduce the volume of the sound in order to shift the distribution of the music, the driver can perceive this change.

At block 520, the audio distribution component determines if the measured force or acceleration still satisfy the threshold. If yes, the method 500 returns to block 515 to determine the appropriate sound distribution. That is, the audio distribution component can periodically or continuously change the sound distribution by monitoring the measured force or acceleration. However, if the threshold is no longer satisfied, at block 525, the audio distribution component returns the distribution of sound to its pre-adjusted state or default configuration. If the audio component dynamically updates the sound distribution based on changes in the measured force or acceleration, the transition between the pre-adjusted state to the altered sound distribution and back again may be perceived as a continuous (smooth) transition.

Figure 6:
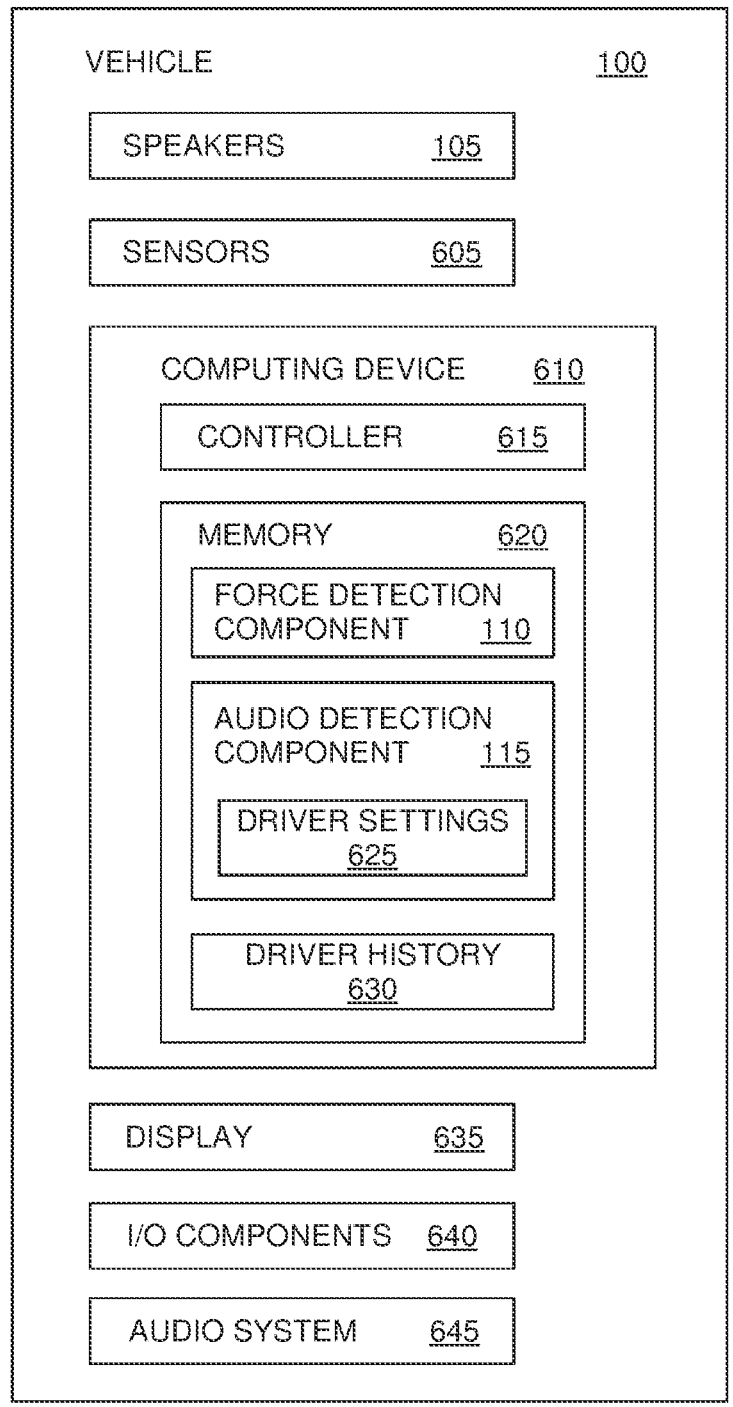
FIG. 6 is a vehicle that includes a computing device for adjusting the distribution of sound in a vehicle.

FIG. 6 is a vehicle 100 that includes a computing device 610 for adjusting the distribution of sound in the vehicle 100. Like the system discussed in FIG. 1, the vehicle 100 includes a plurality of speakers 105, the force detection component 110, and the audio detection component 115. In addition, the vehicle includes sensor 605, the computing device 610, display 635, I/O component 640, and audio system 645. The sensors 605 may be any sensor capable of providing data to measure a force or acceleration associated with the vehicle 100 caused by a driver's actions such as speeding up, slowing down, turning, etc. For example, the sensors 605 may include accelerometers or gyroscopes for determining the vehicle's orientation and acceleration in any number of directions. Or the sensor 605 may include a speedometer which can be monitored over time to determine the cars acceleration in the forward or backwards direction. The sensor 605 may be part of the vehicle's on-board computer or a separate component. For example, the sensor 605 may be an accelerometer in the driver's or passenger's mobile device (e.g., phone or tablet) that is communicatively coupled to the computer device 610.

The computing device 610 includes a controller 615 and memory 620. The controller 615 may be an ASIC or a plurality of ASICs that is capable of performing the functions described herein. For example, the controller 615 may be a processor with one or more cores. In one embodiment, the computing system 610 may borrow a processor on a personal computing device, such as a smart phone or tablet, within the vehicle to add extra processing power in order to perform the techniques described herein.

Memory 620 may include volatile memory, non-volatile memory, or some combination of both. As shown, the force detection component 110 and audio detection component 115 are stored in memory. However, in other embodiments, these component 110, 115 may be hardware (e.g., integrated into the controller 615 or separate components), firmware, or some combination thereof.

The audio detection component 115 includes driver settings 625 which may be used to store different settings for different drivers of the vehicle 100. The settings 625 may cause the audio detection component 115 to behave differently depending on which settings are active—e.g., which driver is currently driving the vehicle. The driver settings 625 may specify different threshold values for the different drivers. For example, a teenager who is just learning to drive may be labeled as a novice and have thresholds that are easier to satisfy than a driver who is labeled as an expert. As such, the audio distribution component 115 may be more effective in helping to improve the drivers' behaviors and prevent dangerous situations. Additionally or alternatively, the driver settings 625 may have different settings for different driving modes (regardless of who the actual driver is). For instance, the driver settings 625 may include a "performance mode" where the thresholds for triggering audio feedback are higher than in a "conservative mode." The performance mode may allow the driver to cause more force or acceleration before the sound distribution is altered, while the conservative mode has lower thresholds in order to help the driver to increase fuel economy or avoid excessive wear and tear. The driver may use the I/O components 640 (e.g., a dial, touch screen, trackball, etc.) to change the driver settings 625 to a different mode or level.

Memory 610 also includes driver history 630 which may be used to track a driver's history. For instance, the driver history 630 may record the frequency at which the driver's actions trigger a change in the sound distribution. The driver history 630 may include a time stamp each time the sound distribution is altered. Moreover, the history 630 may specify the driver action that triggered the change in the distribution of the sound—e.g., whether the driver accelerated or decelerated too quickly, turned to sharp, etc. The driver history 630 may also include separate tables for each driver of the vehicle 100.

In one embodiment, the computing device 610 may transmit the driver history 630 to a concerned party. For example, if the driver does not own the vehicle 100, the device 610 may send the driver history 630 to the vehicle's owner (e.g., a parent or guardian of the driver). Alternatively, the driver history 630 may be used to set insurance rates. That is, the number of times the driver exceeds the thresholds may affect the driver's premiums. In another example, the driver history 630 is used to determine preventive maintenance such as replacing tires or brakes. Even if the recommended mileage for a set of tires has not been reached, depending on the driver's habits, the tires may already be worn out.

In another embodiment, the computing device 610 uses the driver history 630 to adapt to the driver. For example, as the driver improves his habits or behaviors and exceeds the thresholds less and less, the audio distribution component 115 may change the driver settings 625 from a novice to an experienced driver. That is, the feedback system recognizes that driver has learned how to avoid the dangerous or inefficient actions that trigger the change in the sound distribution. Additionally or alternatively, the feedback system may use timing parameters to know when to advance the driver settings 625. The feedback system may change the settings 625 from novice after the driver has at least six months experience. In this manner, the feedback system can adapt and customize the thresholds used to determine when to provide audio feedback.

Although the display 635 is shown as integrated into the vehicle 100, this is not a requirement. The display 635 could be on the driver's smart phone, tablet, laptop, or other computing device that is running an application that allows the driver to access the computing device 610, change the driver settings 625, retrieve the driver history 630, etc. The display 630 could also be used to illustrate the change in sound distribution or provide additional warnings. For example, the display 630 may output the sound distributions shown in FIGS. 3A-3D to provide the driver with a visual picture to supplement the sonification. Like display 635, the I/O component 640 may be integrated into the vehicle 100 or part of a separate computing device that permits a user to access and configure the feedback system.

The vehicle 100 also includes an audio system 645 that is coupled to the speakers 105. The audio system may be a radio, CD player, infotainment system, and the like. The audio system may also contain components such as equalizers, amplifiers that drive the speakers 105, compressors, and other digital or analog sound processing equipment. In one embodiment, the audio detection component 115 sends instructions to the audio system 645 in order to change the sound distribution. For example, the audio detection component 115 may instruct the audio system 645 to change the fade and/or the balance, or change the output volume for one or more of the speakers.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer readable medium, for example, that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the disclosure may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present disclosure, a user may access other processing modules or new relevant events or continuous sounds (e.g., events or sounds added by other audio process modules) or related data available in the cloud.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A feedback system, comprising:
    a sensor;
    a force detection component configured to determine at least one of a force and an acceleration associated with a vehicle based on information provided by the sensor; and
    an audio distribution component configured to, upon determining that the at least one of a force and an acceleration satisfy a threshold, change a distribution of a sound in a listening environment of the vehicle relative to a default configuration such that the change in the distribution of the sound mimics an effect of the at least one force or acceleration on the vehicle or a person inside the vehicle.

2. The feedback system of claim 1, wherein the audio distribution component is configured to change the distribution of the sound by altering an output volume ratio between at least two of a plurality of speakers.

3. The feedback system of claim 1, wherein the force detection component is configured to dynamically determine the at least one force and acceleration, and the audio distribution component is configured to dynamically change the distribution of the sound in proportion to a measured value of the at least one force and acceleration.

4. The feedback system of claim 1, wherein, the sound is an output of an audio system located within the vehicle, wherein the default configuration determines how a plurality of speakers output the sound before the audio distribution component changes the distribution of the sound.

5. The feedback system of claim 4, wherein the audio distribution component is configured to, upon determining that the at least one force and acceleration no longer satisfy the threshold, return the distribution of the sound back to the default configuration.

6. The feedback system of claim 1, further comprising driver settings that include different thresholds that respectively correspond to one of a plurality of selectable modes, each representing a skill level of a driver of the vehicle.

7. The feedback system of claim 1, wherein the audio distribution component changes the distribution of the sound by altering at least one of a fade and balance associated with a plurality of speakers.

8. A method comprising:
    determining at least one of a force and an acceleration associated with a vehicle based on information provided by a sensor; and
    upon determining that the at least one of a force and an acceleration satisfy a threshold, changing a distribution of a sound in a listening environment of the vehicle relative to a default configuration such that the change in the distribution of the sound mimics an effect of the at least one force and acceleration on the vehicle or a person inside the vehicle.

9. The method of claim 8, wherein changing the distribution of the sound does not change the tempo or rhythm of the sound.

10. The method of claim 8, further comprising, upon determining that the at least one force and acceleration no longer satisfy the threshold, returning the distribution of the sound back to the default configuration.

11. The method of claim 8, wherein changing the distribution of the sound comprises dynamically changing the distribution of the sound based on a measured changes to the at least one force and acceleration.

12. The method of claim 8, further comprising:
identifying a driver action that caused the at least one force and acceleration; and
selecting a value of the threshold based on the identified driver action, wherein different driver actions correspond to different values of the threshold.

13. The method of claim 12, wherein the identified driver action is one of speeding up the vehicle, braking the vehicle, and turning the vehicle.

14. The method of claim 8, wherein changing the distribution of the sound comprises altering an output volume ratio between at least two of a plurality of speakers.

15. A computer program product for providing feedback, the computer program product comprising:
a computer-readable storage medium having computer-readable program code embodied therewith, the computer-readable program code configured to:
determine at least one of a force and an acceleration associated with a vehicle based on information provided by a sensor; and
upon determining that the at least one of a force and an acceleration satisfy a threshold, change a distribution of a sound in a listening environment of the vehicle relative to a default configuration such that the change in the distribution of the sound mimics an effect of the at least one force and acceleration on the vehicle or a person inside the vehicle.

16. The computer program product of claim 15, wherein the computer-readable program code is configured to:
monitor a driver history indicating a frequency at which a driver of the vehicle performs an action that results in the at least one force and acceleration satisfying the threshold; and
alter a value of the threshold based on the frequency.

17. The computer program product of claim 15, wherein changing the distribution of the sound comprises dynamically changing the distribution of the sound based on any measured changes to the at least one force and acceleration.

18. The computer program product of claim 15, wherein the computer-readable program code is configured to, upon determining that the vehicle is exceeding a speed limit, change the distribution of the sound by oscillating an output volume of at least one of a plurality of speakers.

19. The computer program product of claim 15, wherein changing the distribution of the sound does not change the tempo or rhythm of the sound.

20. The computer program product of claim 15, further comprising:
instruct an audio system in the vehicle to output a pre-defined sound; and
upon determining that the at least one force and acceleration satisfy the threshold, change the distribution of the pre-defined sound in addition to changing the distribution of the sound.

* * * * *